United States Patent
Oppelt (10) Patent No.: US 8,217,657 B2
(45) Date of Patent: Jul. 10, 2012

(54) DIPLEX FILTER AND METHOD TO FILTER SIGNALS

(75) Inventor: Ralph Oppelt, Uttenreuth (DE)

(73) Assignee: Siemens Aktiengesellschaft, Munich (DE)

( * ) Notice: Subject to any disclaimer, the term of this patent is extended or adjusted under 35 U.S.C. 154(b) by 381 days.

(21) Appl. No.: 12/616,855

(22) Filed: Nov. 12, 2009

(65) Prior Publication Data

US 2010/0117653 A1    May 13, 2010

(30) Foreign Application Priority Data

Nov. 12, 2008  (DE) .......................... 10 2008 056 911

(51) Int. Cl.
*G01V 3/00*     (2006.01)
*H03H 7/38*     (2006.01)

(52) U.S. Cl. ........ 324/322; 324/301; 324/316; 324/318; 333/128; 333/132

(58) Field of Classification Search .......... 324/300–322; 333/129, 132
See application file for complete search history.

(56) References Cited

U.S. PATENT DOCUMENTS

| | | | |
|---|---|---|---|
| 3,806,813 A |  | 4/1974 | Eller |
| 3,956,717 A | * | 5/1976 | Fisher et al. .................. 333/121 |
| 6,737,935 B1 | * | 5/2004 | Shafer ........................... 333/132 |
| 6,950,410 B1 |  | 9/2005 | Brandt |
| 7,417,433 B2 |  | 8/2008 | Heid et al. |
| 2008/0055017 A1 | * | 3/2008 | Shafer ........................... 333/132 |

* cited by examiner

*Primary Examiner* — Melissa Koval
*Assistant Examiner* — Emily Chan
(74) *Attorney, Agent, or Firm* — Schiff Hardin LLP (57) ABSTRACT

A diplex filter is formed by two impedance-transforming filters with separate transmission frequency ranges and with separate cut-off frequency ranges and a connection node at which two series elements of the two filters are connected. These two series elements are each fashioned as a parallel oscillating circuit, each parallel oscillating circuit exhibiting a predetermined reactance in a midband of the respective transmission frequency range and a parallel resonance in a midband of the respective cut-off frequency range. The diplex filter can be realized in a simple and cost-effective manner without ferrite-containing special components, for instance inductively coupled coils or tapped coils thereby allowing use thereof in a magnetic resonance tomograph, for example.

17 Claims, 9 Drawing Sheets

DIPLEX FILTER AND METHOD TO FILTER SIGNALS

BACKGROUND OF THE INVENTION

1. Field of the Invention

The invention concerns a diplex filter to filter signals and methods to filter signals by means of a diplex filter.

2. Description of the Prior Art and Background Information

An impedance-transforming diplex filter must necessarily exhibit bandpass characteristics. It is in fact theoretically possible to realize typical low-pass filters or high-pass filters that are dimensioned for identical impedances at the input and output such that such filters have the exact same transmission frequency response for different impedances. However, these typical low-pass filters or high-pass filters have a marked mismatching at these ports since the terminating impedance or the source impedance is not transformed. This is described by A. B. Williams, F. J. Taylor in "Electronic Filter Design Hand Book", 3rd Edition, McGray Hill, 1995, for example.

Furthermore, the two diplex filter paths of a diplex filter must conventionally be high-resistance (high-ohmic) at their junction point or their connection node in the cut-off-state range, this exhibit a reflection factor close to +1. If a branch Y-A of the low-frequency branch and a branch Y-B of the high-frequency branch of the diplex filter are considered, a series inductor must be arranged first in the branch Y-A and a series capacitor must be arranged first in the branch Y-B. Furthermore, shunts cannot be present at the connection nodes to ground since these would represent a short in the other frequency range.

Figure 1:
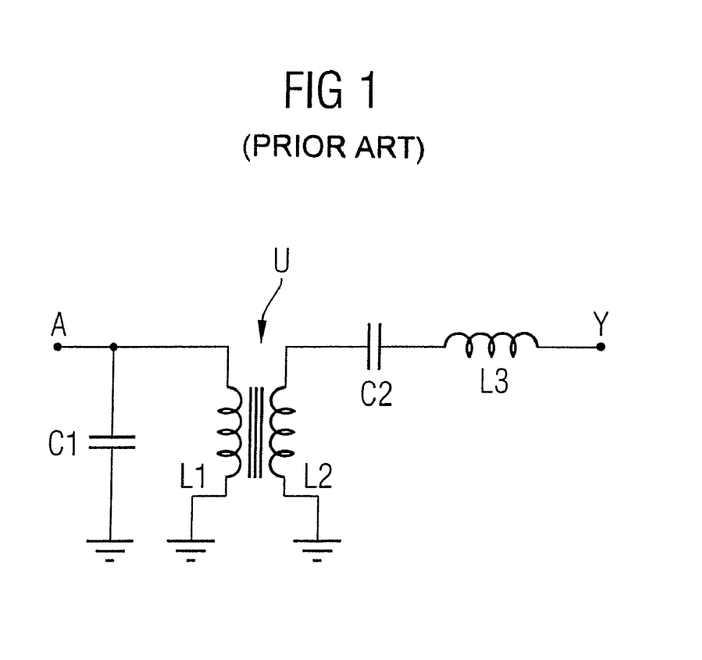
FIG. 1 is a schematic circuit diagram of a first exemplary embodiment of a conventional, impedance-transforming bandpass diplex filter half.

Diplex filters with bandpass characteristics thus can have, for example, series resonance circuits as a series element that are low-resistance at the frequencies of the branch Y-A and are high-resistance at the frequencies of the branch Y-B. In this regard, FIG. 1 shows a schematic circuit diagram of an example of a conventional impedance-transforming bandpass diplex filter half. FIG. 1 shows the branch Y-A with the series resonance circuit C2, L3 as a series element, the capacitor C1 as a shunt and a transformer Ü coupled between them with the coils L1 and L2 as well as the fixed coupling by means of a ferrite.

Furthermore, a tapped coil, two inductively coupled coils or a capacitive voltage splitter can also be inserted in the cross-branch at the ports A and B for impedance transformation.

Figure 2:
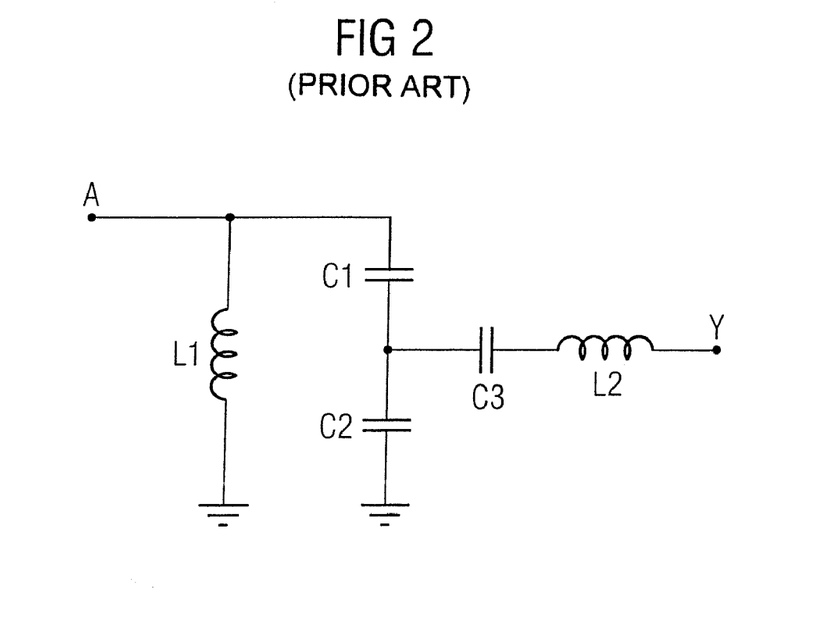
FIG. 2 is a schematic circuit diagram of a second exemplary embodiment of a conventional, impedance-transforming bandpass diplex filter half.

For the last cited variant, FIG. 2 shows a schematic circuit diagram of a second example of a conventional impedance-transforming bandpass diplex filter half of the second order with the capacitive voltage splitter C1, C2. The variant according to FIG. 2, however, functions only within a relatively severely limited bandwidth.

The above, conventional, impedance-transforming diplex filters according to FIGS. 1 and 2 are known from G. Fritsche, "Entwurf passiver Analog-Vierpole" ["Design of passive analog quadrupoles"], Netzwerke 11, Page 206-214, Akademieverlag, 1979, for example.

However, the exemplary filter according to FIG. 1 has the disadvantage that special components such as transformers are required. Moreover, no ferrites are possible if the filter is to be used in a magnetic field (for example in a magnetic resonance tomography apparatus), which severely limits the realization of inductively coupled coils (as in FIG. 1) and causes greater losses.

Furthermore, impedance-transforming high-passes and low-passes of the fourth order are known from the publication "Transformierende Hoch- und Tiefpässe vierter Ordnung—exakter Algorithmus mit Beispielen" ["Transforming high- and low-passes of the fourth order—exact algorithm with examples"], Ulrich Fleischmann, Elektronikschau 6/1981, Pages 26-35. As already stated above, filters can be transformed due to their inherent properties across a finite bandwidth so that the terms "high-pass" and "low-pass" are meaningful only to a certain approximation. The low-pass thus also has a lower limit frequency as of which the transmission $|S_{21}|$ then decreases again. In an analogous manner, the high-pass has an upper limit frequency above which the transmission $|S_{21}|$ decreases, and in fact up to a minimum value:

$$|s_{21}| = \sqrt{1-|r|^2} \text{ with } |r| = \left|\frac{\varsigma-1}{\varsigma+1}\right|$$

Naturally, it is possible in principle to interconnect the high-pass explained above and the low-pass explained above into a "diplexer" or into a "diplex filter" since these have a series element at the low-resistance port. However, the present inventor has established by means of tests that the cut-off effects fall off far too little in the respective unwanted frequency ranges (the cut-off frequency range), so that only an imperfect separation of the frequency ranges (transmission frequency range and cut-off frequency range) is possible. Furthermore, the present inventor has established by means of tests that, given an interconnection of both filters, these interact too strongly, such that the resulting frequency response can no longer represent a diplexer.

This problem is explained in detail using the example below and using FIGS. 3 through 7.

Figure 3:
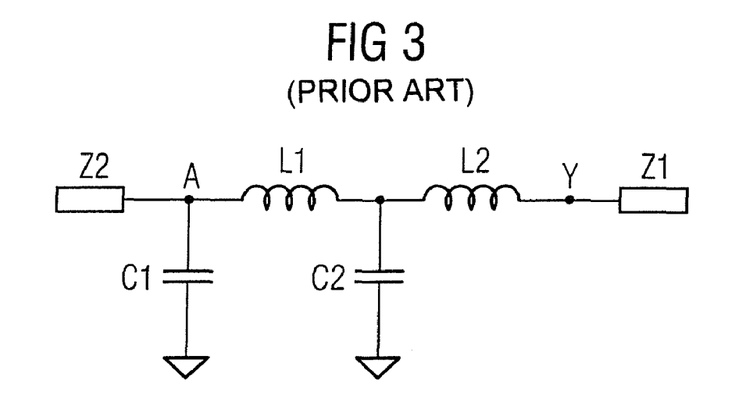
FIG. 3 is a schematic circuit diagram of an exemplary embodiment of a conventional low-pass filter of the fourth order.
Figure 4:
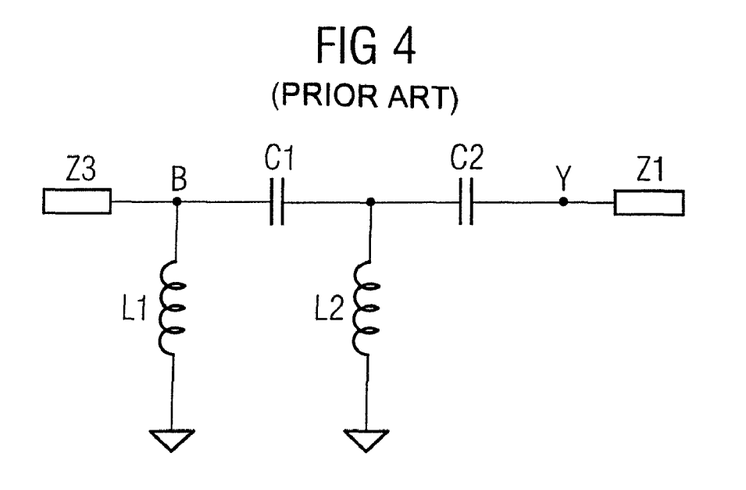
FIG. 4 is a schematic circuit diagram of a conventional high-pass filter of the fourth order.

For this FIG. 3 shows a schematic circuit diagram of an exemplary embodiment of a conventional low-pass filter of the fourth order, and FIG. 4 shows a schematic circuit diagram of an exemplary embodiment of a conventional high-pass filter of the fourth order.

In this example, the transmission range D1 of the high-pass filter or high-pass branch according to FIG. 4 is 11 through 12.5 MHz and the transmission range D2 of the low-pass branch or low-pass according to FIG. 3 is 7.5 to 9 MHz. The respective terminating impedance Z1 is given 50Ω at the common port Y with the filters of FIGS. 3 and 4 interconnected. In this case, the impedance 4*50Ω=200Ω should appear at the ports A or, respectively, B in the respective transmission frequency range.

For ç=200/50, the following values for the first transmission frequency range D1 from 11 to 12.5 MHz of FIG. 4 result according to the teaching of the aforementioned publication "Transformierende Hoch- und Tiefpässe vierter Ordnung—exakter Algorithmus mit Beispielen":

L1=2.35 µH, C1=90.8 pF, L2=908 nH and C2=235 pF and the following values for the second transmission range D2 7.5 through 9 MHz result according to FIG. 3:

C1=112 pF, L1=2.88 µH, C2=288 pF, L2=1.12 µH

To provide a diplex filter, the circuit diagrams of FIGS. 3 and 4 would have to be interconnected at the connection point or the node Y. For this FIG. 7 schematically shows the two transmission frequency responses of an interconnection of the low-pass filter according to FIG. 3 and the high-pass filter according to FIG. 4.

Figure 7:
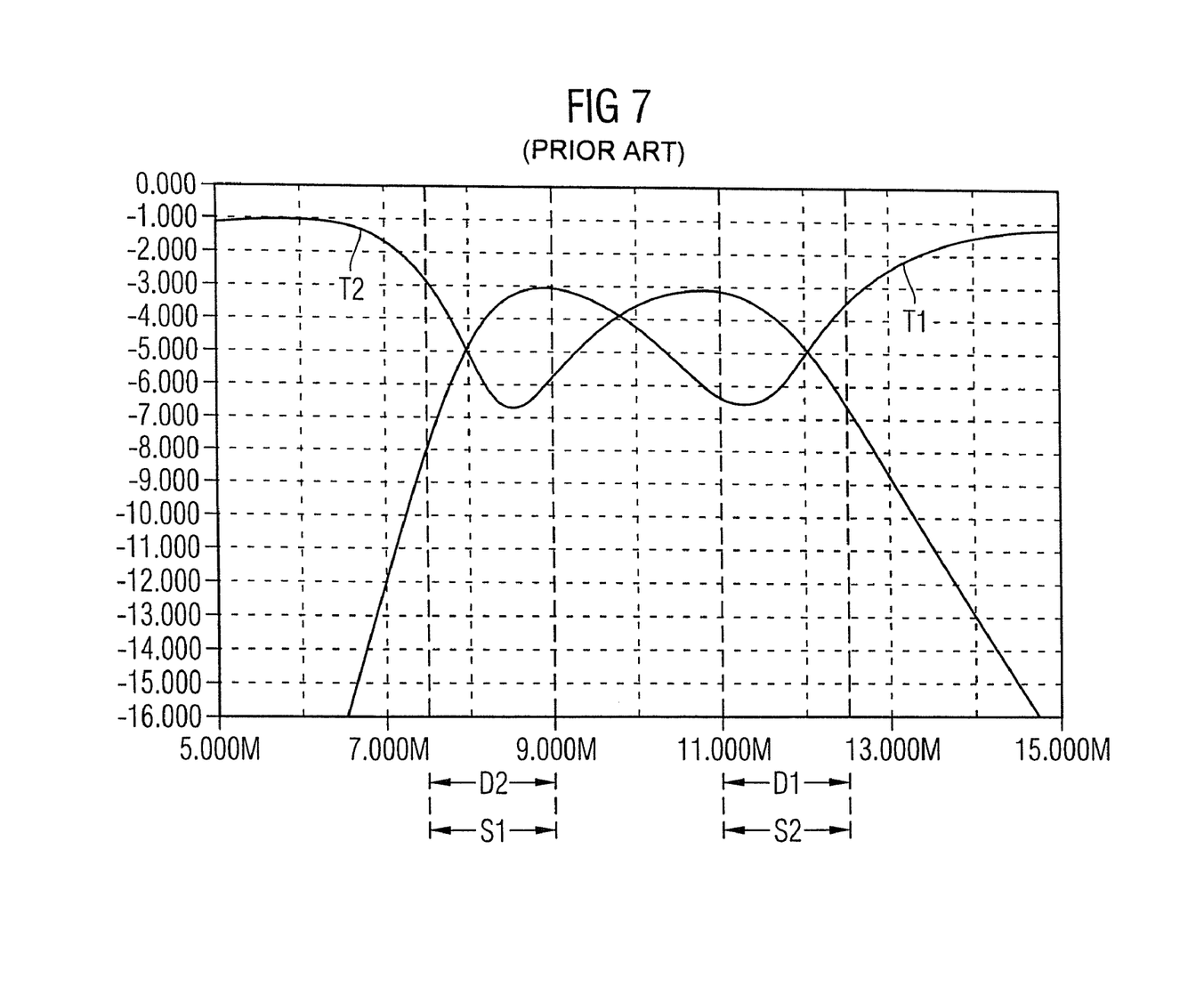
FIG. 7 is a schematic transmission frequency response of an interconnection of the low-pass filter according to FIG. 3 and the high-pass filter according to FIG. 4.

In FIG. 7 the reference character T1 thereby shows the transmission of the high-pass filter branch (or furthermore also of the first filter) given an interconnection of the high-pass filter according to FIG. 4 with the low-pass filter according to FIG. 3.

Analogously, in FIG. 7 the reference character T2 shows the transmission of the low-pass filter branch (or furthermore also of the second filter) given an interconnection of the high-pass filter according to FIG. 3 with the low-pass filter according to FIG. 4.

The reference character D1 also designates the transmission frequency range of the high-pass filter branch or of the first filter. The transmission frequency range of the first filter lies between 11 and 12.5 MHz, for example.

The reference character S1 also designates the cut-off frequency range of the high-pass filter branch. The cut-off frequency range S1 lies at 7.5 to 9 MHz, for example.

The reference character D2 correspondingly designates the transmission frequency range of the low-pass filter branch or second filter. The cut-off frequency range S1 lies between 7.5 and 9 MHz, for example.

Furthermore, the reference character D2 designates the transmission frequency range of the low-pass filter branch or second filter. The transmission frequency range D2 lies at 7.5 to 9 MHz, for example.

The reference character S2 analogously designates the cut-off frequency range of the low-pass filter branch or second filter. The cut-off frequency range S2 lies at 11 to 12.5 MHz, for example.

From the above values and FIG. 7 it is clear that D1 and S2 and D2 and S1 conventionally, respectively correspond to the design of a diplex filter.

Figure 5:
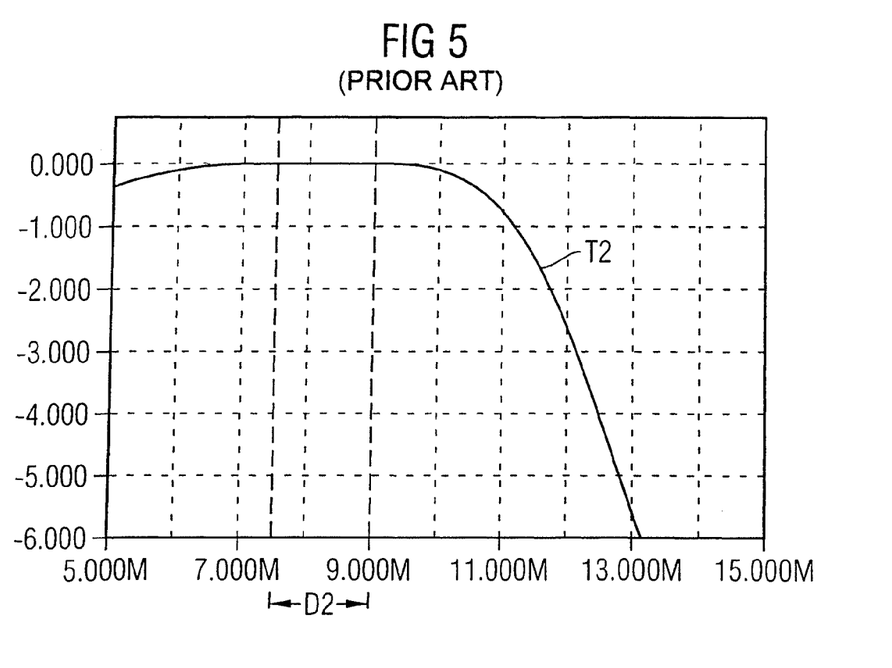
FIG. 5 is a schematic transmission frequency response for the low-pass filter of the fourth order according to FIG. 3.
Figure 6:
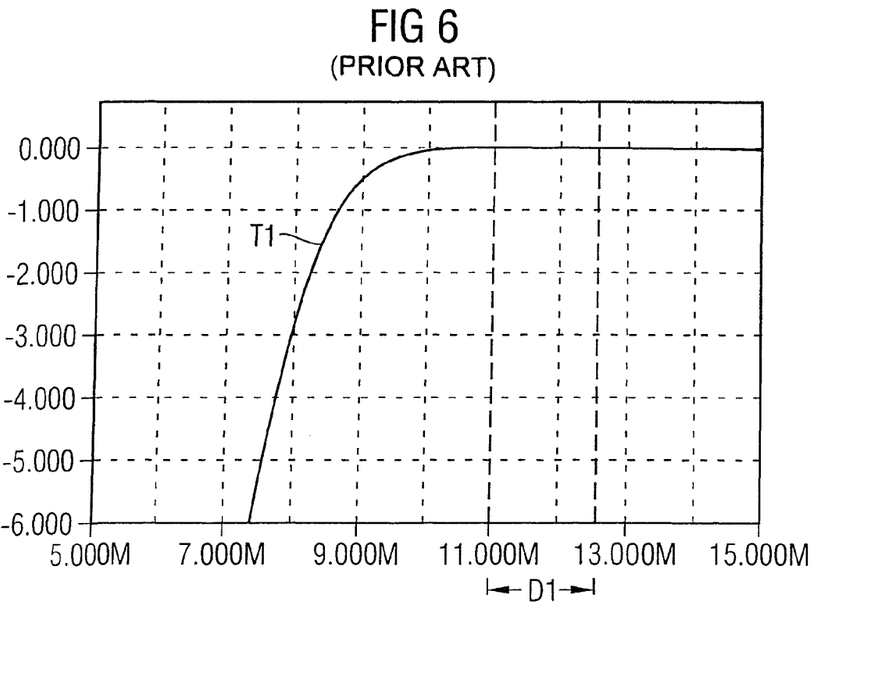
FIG. 6 is a schematic transmission frequency response for the high-pass filter of the fourth order according to FIG. 4.

However, FIG. 7 also shows that the interconnected filters, the low-pass filter according to FIG. 3 and the high-pass filter according to FIG. 4 interact, in particular in the range D2, S1 (7.5 through 9 MHz) and D1, S2 (11 through 12.5 MHz), such that they specifically do not reach the desired stringing together of the frequency responses of FIGS. 5 and 6, and therefore cannot form diplex filters.

SUMMARY OF THE INVENTION

It is accordingly an object of the present invention to provide an improved diplex filter.

According to the invention, this above object is achieved by a diplex filter having two impedance-transforming filters with separate transmission frequency ranges and with separate cut-off frequency ranges, wherein each filter has a first number of shunts and a second number of series elements, and a connection node at which two series elements of the two filters are interconnected that are respectively fashioned as a resonance circuit, and wherein the respective parallel resonance circuit exhibits a predetermined reactance in the midband of the respective transmission frequency range and a parallel resonance in a midband of the respective cut-off frequency range.

The above object also is achieved in accordance with the invention by a method for filtering signals in a diplex filter that includes the following steps of providing two impedance-transforming filters with separate transmission frequency ranges and with separate cut-off frequency ranges, wherein each filter has a first number of shunts and a second number of series elements, connecting two series elements of the two filters by means of a connection node, and forming the two series elements interconnected by the connection node as a respective parallel resonance circuit to fashion the diplex filter, with the respective parallel resonance circuit exhibiting a predetermined reactance in the midband of the respective transmission frequency range and a parallel resonance in a midband of the respective cut-off frequency range.

For example, a first impedance-transforming filter is fashioned as a high-pass filter and a second impedance-transforming filter is fashioned as a low-pass filter.

The diplex filter formed according to the invention is a three-port filter with a port Y between the connection node and ground, a port A between one terminal node of the low-pass filter to connect an external impedance and ground and a port B between a terminal node of the high-pass filter to connect a different external impedance and ground.

With the present invention, a diplex filter can advantageously be realized in a simple and cost-effective manner without special components (for instance inductively coupled coils or tapped coils) with broad transmission or, respectively, cut-off ranges. In the diplex filter according to the invention, two signals with different frequency ranges that are different but of finite range are combined by the two ports A and B at one port (the port Y) into a frequency multiplex signal. In reverse, the diplex filter can also spectrally divide a frequency multiplex signal arriving from the common port Y at the two different ports A and B by means of the high-pass and low-pass split.

By the use of the two impedance-transforming filters in the diplex filter according to the invention, a real impedance $Z_0$ connected at the port Y in a respective frequency range can, scaled by a factor of ç, be mapped to the respective ports A and B as $çZ_0$. For example, an impedance at the collector of a transistor amplifier stage which is normally markedly higher than 50Ω can thus be transformed at a standardized 50Ω coaxial line at the common output Y without an additional matching network. Since this is omitted, the transmission losses in the paths A-Y and B-Y are very low.

The diplex filter according to the invention can also be used in the field of an MR magnet in that the diplex filter according to the invention can be realized without special components such as ferrite-containing, inductively-coupled coils or tapped coils.

The values for the capacitor C and the inductor L of the parallel resonance circuit of the high-pass filter or high-pass filter path are to be calculated according to the invention as follows:

$$C = \frac{C_s}{F} \text{ and } L = \frac{1}{(2\pi f_{mTP})^2 \cdot C}$$

with $$F = 1 - \left(\frac{f_{mTP}}{f_{mHP}}\right)^2$$

The parameter $C_S$ is calculated as the capacitance of an impedance-transforming high-pass filter of the fourth order according to the teaching of Ulrich Fleischmann in "Transformierende Hoch- und Tiefpässe vierter Ordnung—exakter Algorithmus mit Beispielen" Elektronikschau 6/1981, Pages 26-35.

The parameter $f_{mTP}$ designates the geometric center frequency of the transmission frequency range of the second filter or low-pass filter of the diplex filter. The parameter $f_{mHP}$ analogously designates the geometric center frequency of the transmission frequency range of the first filter or high-pass filter of the diplex filter.

The values for the capacitance C and the inductance L of the parallel resonance circuit of the second filter or high-pass filter are furthermore to be calculated as follows:

$$L = L_s \cdot F$$

and $$C = \frac{1}{(2\pi f_{mHP})^2 L}$$

According to a preferred development of the invention, the predetermined reactance of the respective parallel resonance circuit is suitable to fashion the respective transmission frequency range.

The fashioning of the respective desired transmission frequency range is advantageously possible via the use of the predetermined reactance for the respective parallel resonance circuit.

According to a further preferred development, the respective parallel resonance of the respective parallel resonance circuit is suitable to fashion the respective cut-off frequency range.

The fashioning of the respective desired cut-off frequency range is advantageously possible via the respective parallel resonance of the respective parallel resonance circuit.

According to a further preferred development, the respective impedance-transforming filter is fashioned as a bidirectional, transforming filter.

By the fashioning of the impedance-transforming filter as a bidirectional filter it is possible to combine two different signals from the ports A and B at the port Y as a frequency multiplex signal, and on the other hand to split a frequency multiplex signal arriving at the port Y at the two different ports A and B.

One signal A can likewise be transferred to Y and another signal can be transferred from Y to B, thus in the opposite direction.

According to a further preferred development, the respective filter is fashioned as a filter of the n-th order.

According to a further preferred development, the respective filter of the n-th order has $$\frac{n}{2}$$

series elements and $$\frac{n}{2}$$

shunts (with $n \geq 4$) if n is even. According to a further preferred development, the respective filter of the n-th order has $(n+1)/2$ series elements and $(n-1)/2$ shunts (with $n \geq 4$) if n is odd.

According to a further preferred development, the respective series element and the respective shunt are fashioned from at least one impedance.

According to a further preferred development, the respective filter is fashioned as a filter of the fourth order.

According to a further preferred development, the first impedance-transforming filter has a first, higher transmission frequency range and a first, lower cut-off frequency range. The second impedance-transforming filter advantageously has a second, lower transmission frequency range and a second, higher cut-off frequency range.

The first low transmission frequency range of the first impedance-transforming filter and the second cut-off frequency range of the second impedance-transforming filter advantageously correspond. The first cut-off frequency range of the first impedance-transforming filter and the second transmission frequency range of the second impedance-transforming filter analogously advantageously correspond.

According to a further preferred development, each filter is fashioned as a two port filter which is formed from a first port between the connection node and ground and a second port between the connection node and a terminal node to connect an external impedance.

According to a further preferred development, the series elements of the respective filters are arranged between the respective terminal node and the connection node and the shunts of said respective filter are arranged between the connection node and ground.

According to a further preferred development, the shunts of the first filter have at least one coil; and/or the series elements of the first filter have at least one capacitor; and/or the shunts of the second filter have at least one capacitor; and/or the series elements of the second filter have at least one coil.

According to a further preferred development, all series elements of the two filters are respectively fashioned as a parallel resonance circuit made up of at least one coil and at least one capacitor.

The filter effect between the two frequency ranges to be separated is optimized via the fashioning of all series elements of the two filters as a parallel resonance circuit.

According to a further preferred development, all series elements of the second filter are respectively fashioned as a parallel resonance circuit. The series elements of the first filter that is coupled to the connection node resonance circuit; and the shunt coupled with the coupling node of the first filter is fashioned as a series element.

By omitting a parallel resonance circuit in this preferred development, in contrast to the development executed above a complicated and cost-intensity coil is also omitted. The filter effect is comparable to the preferred development mentioned above in which all series elements of the two filters are fashioned as a parallel resonance circuit.

The present invention also encompasses a magnetic resonance tomography apparatus with a diplex filter as explained above.

The diplex filter according to the invention is, for example, advantageously used in a magnetic resonance tomography apparatus, in particular because the diplex filter according to the invention possesses no inductively coupled coil or tapped coils and thus can be used in a field of an MR magnet.

DESCRIPTION OF THE PREFERRED EMBODIMENTS

Identical or functionally identical means and devices are provided in all figures with the same reference characters insofar as it is not indicated otherwise.

Figure 8:
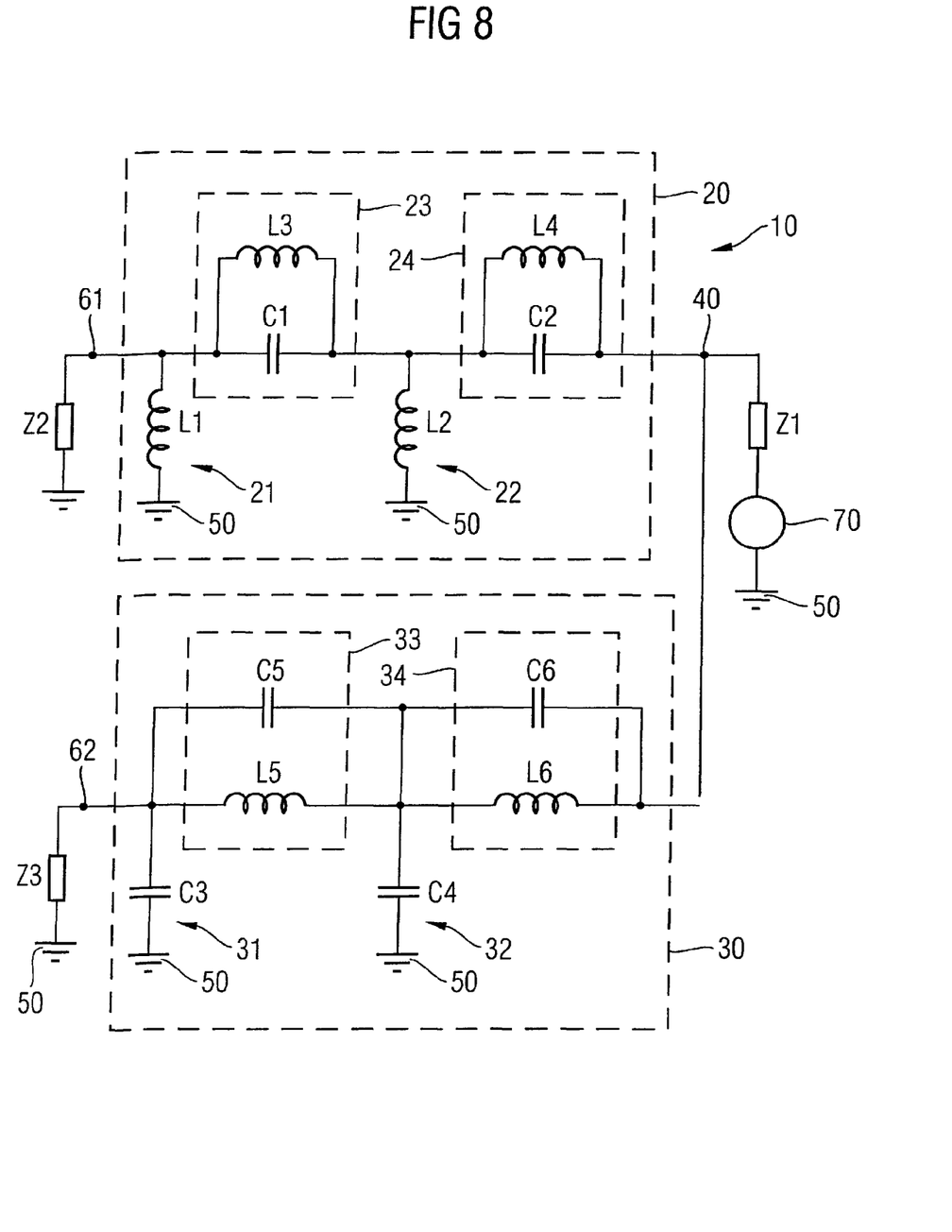
FIG. 8 is a schematic circuit diagram of a first exemplary embodiment of a diplex filter according to the invention.

FIG. 8 shows a schematic circuit diagram of a first exemplary embodiment of a diplex filter 10 according to the invention.

The impedance-transforming diplex filter 10 has two impedance-transforming filters 20, 30 with separate transmission frequency ranges D1, D2 and with separate cut-off frequency ranges S1, S2. The respective filter 20, 30 has a first number of shunts 21, 22; 31, 32 and a second number of series elements 23, 24; 33, 34. For example, the first impedance-transforming filter 20 is a high-pass filter and the second impedance-transforming filter 30 is a low-pass filter. Furthermore, the first number is advantageously equal to the second number.

The respective impedance-transforming filter 20, 30 is advantageously fashioned as a bidirectional, impedance-transforming filter 20, 30. The respective filter 20, 30 can advantageously be fashioned as a filter of the n-th order with $n \geq 4$. n is thereby four, for example. The respective filter 20, 30 of the n-th order advantageously has n half-series elements 23, 24; 33, 34 and n half-shunts 21, 22; 31, 32 if n is even. According to the exemplary embodiment according to FIG. 8, the high-pass filter 20 has two shunts 21, 22 and two series elements 23, 24. The same analogously applies for the low-pass filter 30 according to FIG. 8.

The high-pass filter 20 is connected between a connection node 40 and a terminal node 61 for the connection of an additional impedance Z2. The impedance Z2 has, for example, 200Ω and is connected between the terminal node 61 and ground 50. Contrary to this, an impedance Z1 with (for example) 50Ω and voltage source 70 is connected between the connection node 40 and ground 50.

As already stated above, the high-pass filter 20 is formed by two shunts 21, 22 and two series elements 23, 24. A first shunt 21 is connected between the terminal node 61 and ground 50. A first series element 23 made up of the capacitor C1 and the inductor L3 is connected to the first shunt 21 on the one side and to the second shunt 22 on the other side. The second shunt 22 has a coil L2 that is connected to ground 50.

A second series element 24 made up of capacitor C2 and the inductor L4 is connected to the second shunt 22 and connected with the connection node 40.

The low-pass filter 30 has as shunts 31, 32 a capacitor C3 and a capacitor C4. The series elements 33, 34 of the low-pass filter 30 are each fashioned as a parallel resonance circuit with a respective inductor L5 or L6 and a respective capacitor C5 or C6.

The low-pass filter 30 is connected between the connection node 40 and a terminal node 62 for the connection of an additional external impedance Z3. The additional external impedance Z3 has, for example, 200Ω and is connected with the terminal node 62 and ground 50.

Figure 9:
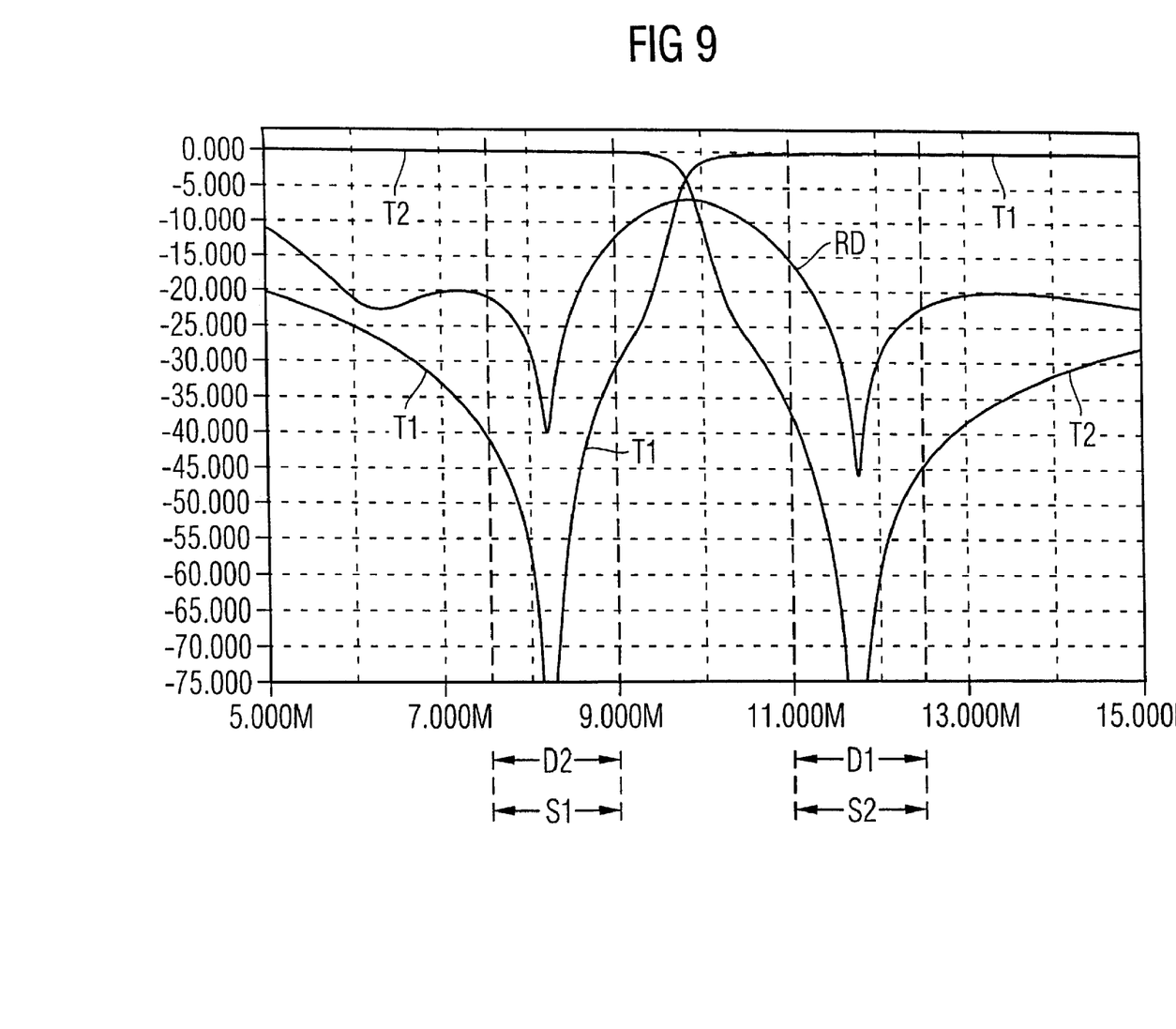
FIG. 9 is a transmission frequency response of the diplex filter according to FIG. 8.

FIG. 9 shows the transformation and reflection frequency response of the diplex filter 10 according to FIG. 8.

In FIG. 9, the reference character T1 thereby shows the transmission of the high-pass filter branch 20 (also called the first filter in the following).

In FIG. 9, the reference character T2 analogously shows the transmission of the low-pass filter branch 30 (also called the second filter in the following).

The reference character D1 additionally designates the transmission frequency range of the high-pass filter branch 20 or first filter. The transmission frequency range D1 of the first filter 20 lies between 11 and 12.5 MHz, for example.

The reference character S1 also designates the cut-off frequency range of the high-pass filter branch 20. The cut-off frequency range S1 lies at 7.5 to 9 MHz, for example.

The reference character D2 correspondingly designates the transmission frequency range of the low-pass filter branch 30 or second filter. The cut-off frequency range S1 lies between 7.5 and 9 MHz, for example.

The reference character S2 analogously designates the cut-off frequency range of the low-pass filter branch 30 or second filter. The cut-off frequency range S2 lies at 11 to 12.5 MHz, for example.

From the above values and FIG. 9 it is clear that D1 and S2 as well as D2 and S1 correspond to fashion a diplex filter 10.

Furthermore, FIG. 9 shows a reflection damping RD of the diplex filter 10. Here it is noteworthy that the reflection damping RD is minimal and thus causes a minimal energy loss.

Figure 10:
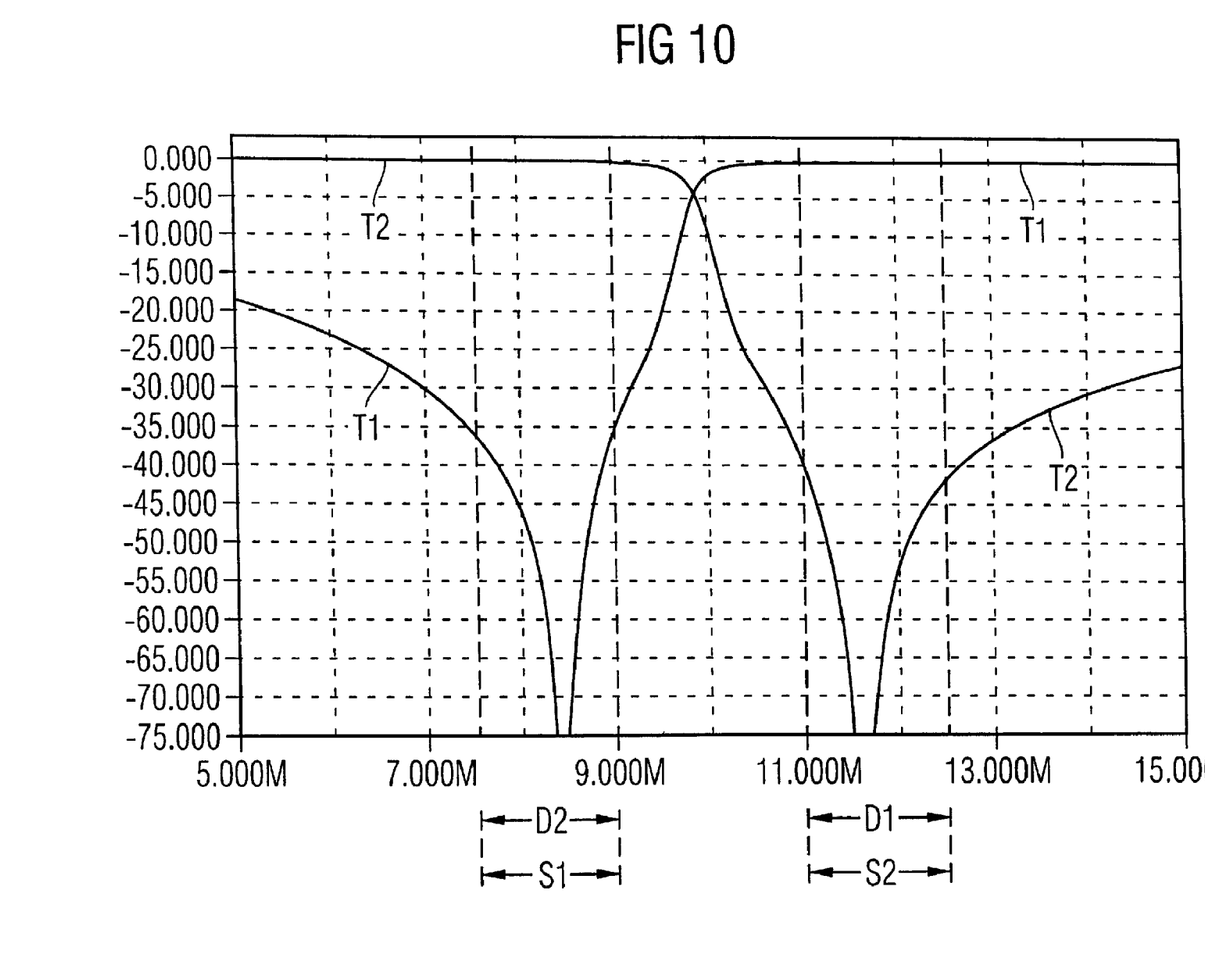
FIG. 10 is a transmission frequency response of a diplex filter according to FIG. 8 that is modified by means of simulation.

FIG. 10 shows the transmission frequency response of a diplex filter 10 according to FIG. 8 that is modified by means of a simulation. The cut-off circuits S1, S2 are thereby easily corrected by means of simulation in order to make the cut-off behavior similar at the respective band limits. The cut-off attenuation is then at least 35 dB.

Figure 11:
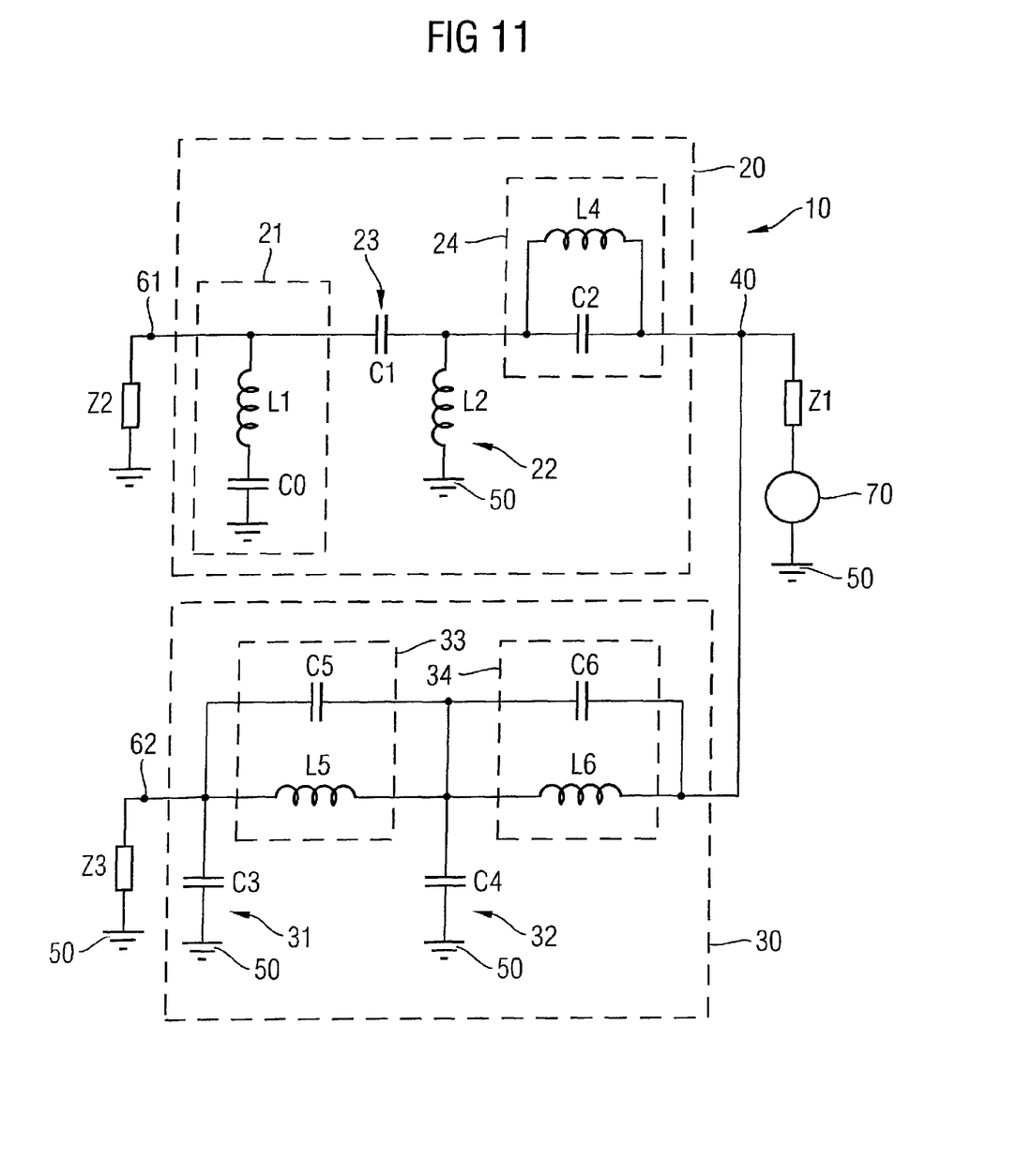
FIG. 11 is a schematic circuit diagram of a second exemplary embodiment of a diplex filter according to the invention.

FIG. 11 shows a schematic circuit diagram of a second exemplary embodiment of a diplex filter according to the invention. The second exemplary embodiment according to FIG. 8 differs from the first exemplary embodiment according to FIG. 8 exclusively to the effect that the series element 23 is no longer fashioned as a parallel resonance circuit but rather is formed with only a single capacitor C1, and that for this the shunt 21 is no longer fashioned by means of a single coil L1 but rather is formed from a series resonance circuit with a coil L1 and with a capacitor C0.

For a given shunt inductor $L_q$ provided according to the teaching from Fleischmann, it follows for the series resonance circuit comprised of the elements L1 and C0 that:

$$L_1 = \frac{L_q}{F}$$

and $$C_0 = \frac{1}{(2\pi f_{mTP})L_1}$$

-continued with $$F = 1 - \left(\frac{f_{mTP}}{f_{mHP}}\right)^2$$

The parameter $f_{mTP}$ designates the geometric center frequency of the transmission frequency range of the second filter or low-pass filter of the diplex filter. The parameter $f_{mHP}$ analogously designates the geometric center frequency of the transmission frequency range of the first filter or high-pass filter of the diplex filter.

Figure 12:
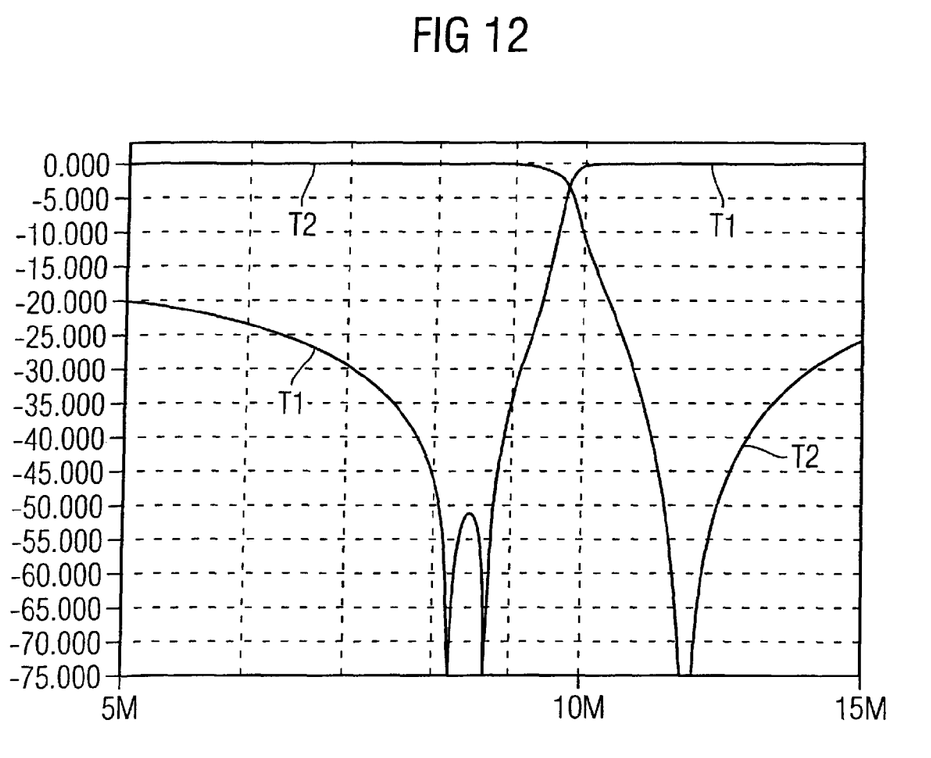
FIG. 12 is a transmission frequency response of the diplex filter according to FIG. 11.

In this regard FIG. 12 shows a corresponding transmission frequency response of the diplex filter 10 according to FIG. 11. It can be seen that the cut-off attenuation according to FIG. 12 is comparable to the cut-off attenuation according to FIGS. 9 and 10.

Figure 13:
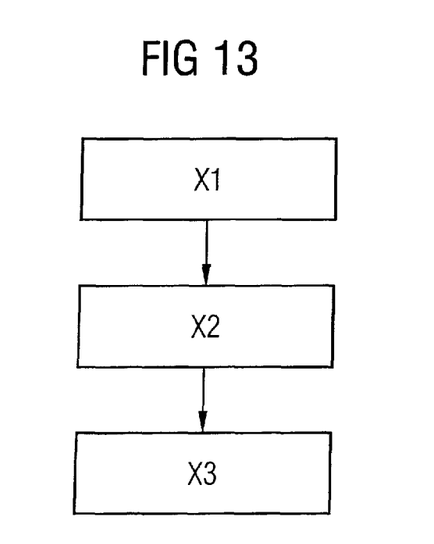
FIG. 13 is a schematic workflow diagram of an exemplary embodiment of a method to filter signals by means of a diplex filter.

A schematic workflow diagram of an exemplary embodiment of a method according to the invention to filter signals by a diplex filter 10 is shown in FIG. 13.

The method according to the invention is subsequently explained using the block circuit diagram in FIG. 13 with reference to the circuit diagram in FIG. 8. The method according to the invention according to FIG. 13 has the method steps X1-X3:

Method Step X1:

Two impedance-transforming filters 20, 30 with separate transmission frequency ranges D1, D2 and with separate cut-off frequency ranges S1, S2 are provided, wherein the respective filter 20, 30 has a first number of shunts 21, 22; 31, 32 and a second number of series elements 23, 24; 33, 34.

Method Step X2:

Two series elements 24, 34 of the two filters 20, 30 are connected by means of a connection node 40. The two series elements 24, 34 of the respective filter 20, 30 are thereby coupled or, respectively, connected with the respective output line of the respective filter 20, 30.

Method Step X3:

The two series elements 24, 34 coupled by means of the connection node 40 are respectively fashioned as a parallel resonance circuit C2, L5; L7, C7, wherein the respective parallel resonance circuit C2, L4; C6, L6 exhibits a predetermined reactance in a midband of the respective transmission frequency range D1, D2 and a parallel resonance in a midband of the respective cut-off frequency range S1, S2. Although modifications and changes may be suggested by those skilled in the art, it is the intention of the inventor to embody within the patent warranted hereon all changes and modifications as reasonably and properly come within the scope of his or her contribution to the art.

I claim as my invention:

1. An impedance-transforming diplex filter, comprising:
a first impedance-transforming filter having a first transmission frequency range and a first cut-off frequency range;
a second impedance-transforming filter having a second transmission frequency range and a second cut-off frequency range, said first and second transmission frequency ranges being separate from each other and said first and second cut-off frequency ranges being separate from each other;
each of said first and second impedance-transforming filters comprising a plurality of shunts and a plurality of series elements;
a connection node that couples one of the series elements of said first impedance-transforming filter with one of the series elements of said second impedance-transforming filter, as coupled series elements;
each of said coupled series elements being formed as a parallel resonance circuit; and
the parallel resonance circuit forming the coupled series element of the first impedance-transforming filter having a predetermined reactance in a midband of said first transmission frequency range and a parallel resonance in a midband of said first cut-off frequency range, and the parallel resonance circuit forming the coupled series element of the second impedance-transforming filter having a predetermined reactance in a midband of the second transmission frequency range and a parallel resonance in a midband of the second cut-off frequency range.

2. A diplex filter as claimed in claim 1 wherein said predetermined reactance of said parallel resonance circuit forming the coupled series element of said first impedance-transforming filter is effective over said first transmission frequency range, and the predetermined reactance of the parallel resonance circuit forming the coupled series element of the second impedance-transforming filter is effective over said second transmission frequency range.

3. A diplex filter as claimed in claim 1 wherein said predetermined parallel resonance of said parallel resonance circuit forming the coupled series element of said first impedance-transforming filter is effective over said first cut-off frequency range, and the predetermined parallel resonance of the parallel resonance circuit forming the coupled series element of the second impedance-transforming filter is effective over said second cut-off frequency range.

4. A diplex filter as claimed in claim 1 wherein each of said first and second impedance-transforming filters is a bidirectional impedance-transforming filter.

5. A diplex filter as claimed in claim 1 wherein each of said first and second impedance-transforming filter is an n-th order filter with $n \geq 4$.

6. A diplex filter as claimed in claim 5 wherein n is even, and wherein each of said first and second impedance-transforming filters comprises exactly $$\frac{n}{2}$$

series elements and $$\frac{n}{2}$$

shunts.

7. A diplex filter as claimed in claim 5 wherein n is odd, and wherein each of said first and second impedance-transforming filters comprises exactly $(n+1)/2$ series elements and $(n-1)/2$ shunts.

8. A diplex filter as claimed in claim 1 wherein each series element and each shunt of each of said first and second-transformed filter comprises at least one impedance.

9. A diplex filter as claimed in claim 8 wherein each of said first and second impedance-transforming filter is a fourth order filter.

10. A diplex filter as claimed in claim 1 wherein said first transmission frequency range of said first impedance-transforming filter is higher than said second transmission frequency range of said second impedance-transforming filter, and wherein said first cut-off frequency range of said first impedance-transforming filter is lower than said second cut-off frequency range of said second impedance-transforming filter.

11. A diplex filter as claimed in claim 1 wherein each of said first and second impedance-transforming filter has a terminal node configured for connection to an external impedance, and wherein each of said first and second impedance-transforming filter is a two port filter having a first port between said connection node and ground, and a second port between said connection node and said terminal node.

12. A diplex filter as claimed in claim 11 wherein, in each of said first and second impedance-transforming filter, the series elements thereof are connected in series between the terminal node and the connection node, and the shunts thereof are connected between the connection node and ground.

13. A diplex filter as claimed in claim 12 wherein said first transmission frequency range of said first impedance-transforming filter is higher than said second transmission frequency range of said second impedance-transforming filter, and wherein said first cut-off frequency range of said first impedance-transforming filter is lower than said second cut-off frequency range of said second impedance-transforming filter, and wherein the shunts of said first impedance-transforming filter comprise at least one coil, and/or the series elements of the first impedance-transforming filter comprise at least one capacitor, and/or the shunts of the second impedance-transforming filter comprise at least one capacitor, and/or the series elements of the second impedance-transforming filter comprise at least one coil.

14. A diplex filter as claimed in claim 13 wherein each of said first and second impedance-transforming filter has a terminal node configured for connection to an external impedance, and wherein each of said first and second impedance-transforming filter is a two port filter having a first port between said connection node and ground, and a second port between said connection node and said terminal node, and wherein all series elements of said first and second impedance-transforming filters are composed of at least one coil and at least one capacitor.

15. A diplex filter as claimed in claim 14 wherein said first transmission frequency range of said first impedance-transforming filter is higher than said second transmission frequency range of said second impedance-transforming filter, and wherein said first cut-off frequency range of said first impedance-transforming filter is lower than said second cut-off frequency range of said second impedance-transforming filter, and wherein each series element of the second impedance-transforming filter is formed as a parallel oscillating circuit, and wherein a shunt of the first impedance transformed filter is connected to said coupling node and is formed as a series element.

16. A magnetic resonance tomography apparatus comprising:
   a magnetic resonance data acquisition unit adapted to receive a patient therein and operable to acquire magnetic resonance signals from the patient therein, said data acquisition unit comprising at least one magnet that generates a magnetic field and comprising at least one signal path that is susceptible to said magnetic field;
   a diplex filter connected in said at least one signal path; and
   said diplex filter comprising a first impedance-transforming filter having a first transmission frequency range and a first cut-off frequency range, a second impedance-transforming filter having a second transmission frequency range and a second cut-off frequency range, said first and second transmission frequency ranges being separate from each other and said first and second cut-off frequency ranges being separate from each other, each of said first and second impedance-transforming filters comprising a plurality of shunts and a plurality of series elements, a connection node that couples one of the series elements of said first impedance-transforming filter with one of the series elements of said second impedance-transforming filter, as coupled series elements, each of said coupled series elements being formed as a parallel resonance circuit, and the parallel resonance circuit forming the coupled series element of the first impedance-transforming filter having a predetermined reactance in a midband of said first transmission frequency range and a parallel residence in a midband of said first cut-off frequency range, and the parallel resonance circuit forming the coupled series element of the second impedance-transforming filter having a predetermined reactance in a midband of the second transmission frequency range and a parallel resonance in a midband of the second cut-off frequency range.

17. A method for filtering signals with a diplex filter, comprising the steps of:
   providing a first impedance-transforming filter having a first transmission frequency range and a first cut-off frequency range;
   providing a second impedance-transforming filter having a second transmission frequency range and a second cut-off frequency range, said first and second transmission frequency ranges being separate from each other and said first and second cut-off frequency ranges being separate from each other;
   forming each of said first and second impedance-transforming filters comprising a plurality of shunts and a plurality of series elements;
   a coupling one of the series elements of said first impedance-transforming filter via a connection node with one of the series elements of said second impedance-transforming filter, as coupled series elements;
   forming each of said coupled series elements as a parallel resonance circuit; and
   dimensioning the parallel resonance circuit forming the coupled series element of the first impedance-transforming filter to have a predetermined reactance in a midband of said first transmission frequency range and a parallel resonance in a midband of said first cut-off frequency range, and dimensioning the parallel resonance circuit forming the coupled series element of the second impedance-transforming filter to have a predetermined reactance in a midband of the second transmission frequency range and a parallel resonance in a midband of the second cut-off frequency range.

* * * * *